US007598136B2

(12) United States Patent
Park et al.

(10) Patent No.: US 7,598,136 B2
(45) Date of Patent: Oct. 6, 2009

(54) IMAGE SENSOR AND RELATED FABRICATION METHOD

(75) Inventors: Young-Hoon Park, Suwon-si (KR); Jae-Ho Song, Suwon-si (KR); Won-Je Park, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 339 days.

(21) Appl. No.: 11/385,714

(22) Filed: Mar. 22, 2006

(65) Prior Publication Data
US 2007/0007611 A1 Jan. 11, 2007

(30) Foreign Application Priority Data
Jul. 11, 2005 (KR) .................. 10-2005-0062436

(51) Int. Cl.
*H01L 21/8238* (2006.01)
(52) U.S. Cl. .................. 438/201; 438/202; 438/203; 438/211; 438/257; 438/593; 257/E27.133; 257/E27.135; 257/E27.138
(58) Field of Classification Search .................. 438/75, 438/144, 238, 201, 202, 203, 211, 257, 593; 257/E27.133, E31.058, 341, 358, E21.183, 257/E21.185, E21.187, E21.189, E21.617, 257/E27.15, E29.138, E31.084, 414
See application file for complete search history.

(56) References Cited
U.S. PATENT DOCUMENTS

| | | | | |
|---|---|---|---|---|
| 5,525,530 A * | 6/1996 | Watabe | .................. | 438/234 |
| 5,723,355 A * | 3/1998 | Chang et al. | .................. | 438/275 |
| 5,898,196 A * | 4/1999 | Hook et al. | .................. | 257/292 |
| 6,027,962 A * | 2/2000 | Igarashi et al. | .................. | 438/202 |
| 6,159,784 A * | 12/2000 | Ammo et al. | .................. | 438/234 |
| 6,246,070 B1 * | 6/2001 | Yamazaki et al. | .................. | 257/40 |
| 6,271,554 B1 * | 8/2001 | Nozaki et al. | .................. | 257/292 |
| 6,351,002 B1 * | 2/2002 | Pan | .................. | 257/233 |
| 6,436,747 B1 * | 8/2002 | Segawa et al. | .................. | 438/197 |
| 6,475,862 B1 * | 11/2002 | Ando | .................. | 438/264 |
| 6,479,872 B1 * | 11/2002 | Cheng et al. | .................. | 257/360 |
| 6,483,163 B2 * | 11/2002 | Isogai et al. | .................. | 257/446 |
| 6,563,187 B1 * | 5/2003 | Park | .................. | 257/446 |
| 6,784,015 B2 * | 8/2004 | Hatano et al. | .................. | 438/75 |
| 6,853,044 B1 * | 2/2005 | Chung et al. | .................. | 257/444 |
| 6,962,840 B2 * | 11/2005 | Kim | .................. | 438/197 |
| 7,064,406 B2 * | 6/2006 | Mouli | .................. | 257/446 |
| 7,102,184 B2 * | 9/2006 | Rhodes | .................. | 257/292 |
| 7,105,402 B2 * | 9/2006 | McQueen et al. | .................. | 438/241 |

(Continued)

FOREIGN PATENT DOCUMENTS

JP  04-102372  4/1992

(Continued)

*Primary Examiner*—N Drew Richards
*Assistant Examiner*—Ankush K Singal
(74) *Attorney, Agent, or Firm*—Volentine & Whitt, P.L.L.C.

(57) ABSTRACT

An image sensor comprising a transfer gate electrode having a uniform impurity doping distribution is provided. The image sensor further comprises a semiconductor substrate comprising a pixel area, wherein the pixel area comprises an active region and the transfer gate electrode is disposed on the active region. A method of fabricating the image sensor is also provided. The method comprises preparing a semiconductor substrate, forming a polysilicon layer on the semiconductor substrate, doping the polysilicon layer with impurity ions, and patterning the polysilicon layer.

3 Claims, 15 Drawing Sheets

U.S. PATENT DOCUMENTS

| | | | |
|---|---|---|---|
| 7,259,413 B2* | 8/2007 | Rhodes | 257/292 |
| 7,361,542 B2* | 4/2008 | Shim | 438/200 |
| 2002/0009824 A1* | 1/2002 | Maeda | 438/80 |
| 2002/0066901 A1* | 6/2002 | Yamanaka et al. | 257/59 |
| 2003/0022445 A1* | 1/2003 | Taniguchi et al. | 438/257 |
| 2003/0173585 A1 | 9/2003 | Kimura et al. | |
| 2003/0197238 A1* | 10/2003 | Park | 257/446 |
| 2003/0234432 A1* | 12/2003 | Song et al. | 257/440 |
| 2004/0004246 A1* | 1/2004 | Anezaki | 257/315 |
| 2004/0097021 A1* | 5/2004 | Augusto et al. | 438/149 |
| 2005/0179059 A1* | 8/2005 | Rhodes et al. | 257/204 |
| 2005/0285166 A1* | 12/2005 | Lee et al. | 257/292 |
| 2006/0138581 A1* | 6/2006 | Ladd | 257/462 |
| 2006/0192250 A1* | 8/2006 | Lee | 257/338 |
| 2006/0255382 A1* | 11/2006 | Rhodes | 257/292 |
| 2006/0292730 A1* | 12/2006 | Yang et al. | 438/57 |
| 2007/0001235 A1* | 1/2007 | Rhodes | 257/384 |

FOREIGN PATENT DOCUMENTS

| | | |
|---|---|---|
| JP | 2003-037175 | 2/2003 |
| JP | 2003-332454 | 11/2003 |
| KR | 1020030074104 A | 9/2003 |

* cited by examiner

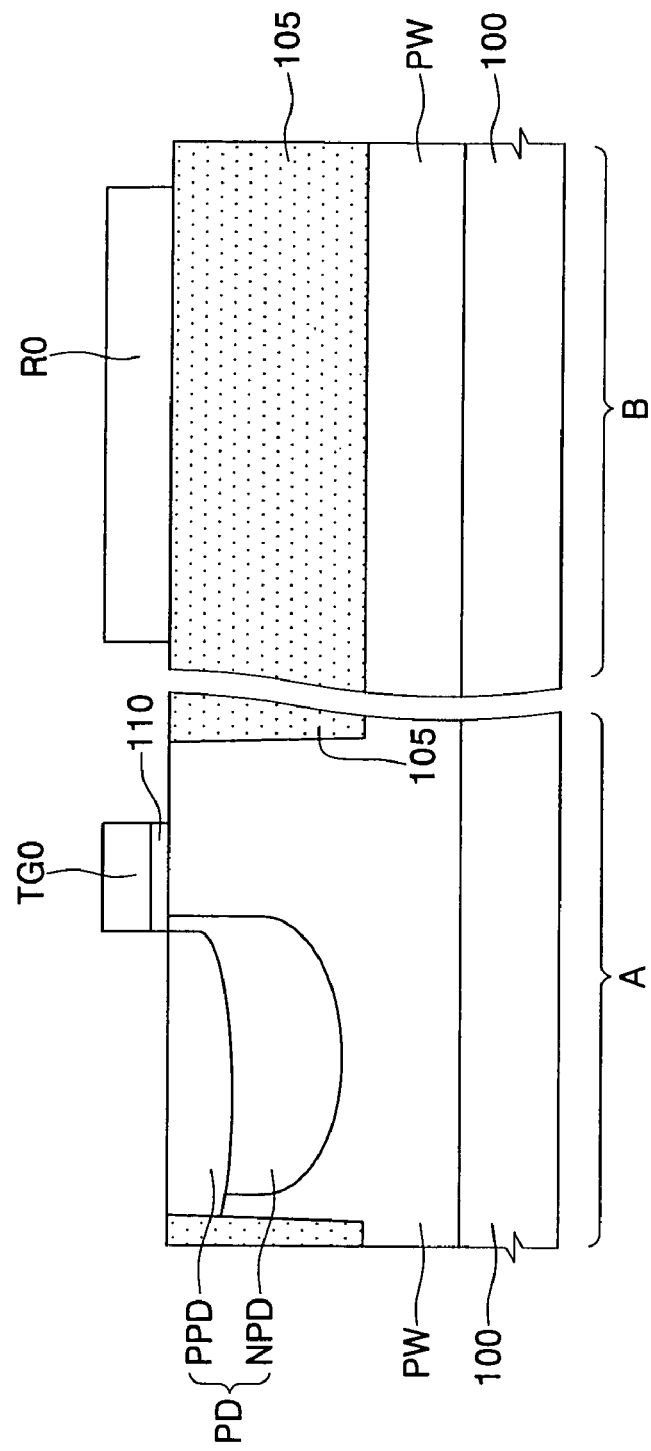

IMAGE SENSOR AND RELATED FABRICATION METHOD

BACKGROUND OF INVENTION

1. Field of the Invention

Embodiments of the invention relate to a semiconductor device and related methods of fabrication. More particularly, embodiments of the invention relate to an image sensor and methods of fabricating the same.

This application claims priority to Korean Patent Application No. 2005-0062436, filed on Jul. 11, 2005, the subject matter of which is hereby incorporated by reference in its entirety.

2. Description of the Related Art

An image sensor is a semiconductor device adapted to convert an optical image into electrical signals. Charge coupled device (CCD) image sensors and complementary metal oxide semiconductor (CMOS) image sensors are two types of image sensors. A CMOS image sensor (CIS) comprises a plurality of pixels aligned two-dimensionally (i.e., along rows and columns) and resistance patterns adapted to amplify the signals generated by the pixels.

Each conventional pixel comprises a photodiode, a floating diffusion region, and a transfer transistor. The photodiode is adapted to convert incident light into electrical charge. The transfer transistor is adapted to transfer the charge accumulated in the photodiode to the floating diffusion region. However, when accumulated charge remains in the photodiode, rather than being completely transferred to the floating diffusion region by the transfer transistor, the so-called "after-image" effect arises. The after-image effect results in a deterioration of the image subsequently formed and displayed in relation to the incident light initially received in the CMOS image sensor. Thus, the transfer transistor should be designed and implemented with a sufficiently large drive capacity to completely transfer accumulated charge from the photodiode to the floating diffusion region.

The conventional transfer transistor comprises a transfer gate electrode which is usually formed on a semiconductor substrate from undoped polysilicon. After the transfer gate electrode is formed, n-type impurities (e.g., doping ions) are implanted into the semiconductor substrate to form the floating diffusion region. The transfer gate electrode is concurrently doped with the n-type impurities during implantation into the semiconductor substrate. The resistance patterns are also formed from undoped polysilicon. Like the transfer gate electrode, the resistance patterns are doped when n-type impurities are implanted into the semiconductor substrate to form the floating diffusion region.

FIGS. 1A through 1D are cross-sectional views illustrating one method adapted to the fabrication of a conventional image sensor.

Referring to FIG. 1A, a semiconductor substrate 100 comprising a pixel area A and a resistance area B is prepared. A p-well PW is formed in semiconductor substrate 100, and an isolation layer 105 is formed to define an active region in p-well PW. Resistance area B is covered by isolation layer 105. A gate insulating layer is formed on semiconductor substrate 100 after the isolation layer is formed. Then, a polysilicon layer is formed on semiconductor substrate 100 after the gate insulating layer is formed.

The conventional image sensor also comprises a CMOS device (not shown) formed in a peripheral circuit area. The CMOS device comprises a PMOS area and an NMOS area. A gate electrode of the PMOS area and a gate electrode of the NMOS area, which are each patterned from a polysilicon layer, are doped with p-type impurities and n-type impurities, respectively. This formation technique allows the respective gate electrode elements to be highly integrated while maintaining excellent electrical characteristics. Thus, the polysilicon layer used in this method is formed from an undoped polysilicon layer.

After the polysilicon layer is formed, it is patterned to form a transfer gate electrode TG0 on semiconductor substrate 100 in pixel area A, and a resistance pattern RO on isolation layer 105 in resistance area B. The gate insulating layer is patterned while the polysilicon layer is patterned, thereby forming a transfer gate insulating layer 110 as part of gate electrode TG0. After the polysilicon layer is patterned, a deep n-type impurity region NPD and a shallow p-type impurity region PPD are respectively formed in the active region at a first side of transfer gate electrode TG0 (i.e., a first portion of the active region), thereby forming a photodiode PD, which comprises deep n-type impurity region NPD and shallow p-type impurity region PPD.

Referring to FIGS. 1A and 1B, a first photoresist pattern 120 is formed to cover the upper portion of photodiode PD. First photoresist pattern 120 is formed such that an edge portion 120' of first photoresist pattern 120 is disposed at an upper central portion of transfer gate electrode TG0. This positioning of the first photoresist pattern 120 minimizes the potential for misalignment errors and provides maximum marginal widths of transfer gate electrode TG0 during subsequent process steps. First impurity ions IP' are implanted into semiconductor substrate 100 using first photoresist pattern 120 as an ion implantation mask. As a result, a LDD impurity region 125 is formed in the active region at a second side of transfer gate electrode TG0 (i.e., in a second portion of the active region on an opposite side of the transfer gate electrode from the first portion of the active region) and is separated from photodiode PD across at least a portion of transfer gate electrode TG0 disposed between LDD impurity region 125 and photodiode PD. Also, a region TG1 doped with first impurity ions IP' is formed in the portion of transfer gate electrode TG0 exposed outside of first photoresist pattern 120. In addition, resistance pattern R1, as doped with first impurity ions IP', is formed on semiconductor substrate 100 in resistance area B. First impurity ions IP' are typically n-type.

Referring to FIG. 1C, second impurity ions IP" are implanted into semiconductor substrate 100 by a tilt ion implantation method using first photoresist pattern 120 as an ion implantation mask. As a result, a shallow impurity region 130 is formed in the second portion of the active region and is separated from photodiode PD across at least a portion of transfer gate electrode TG0. This portion of transfer gate electrode TG0 includes at least the exposed region TG2 disposed between shallow impurity region 130 and photodiode PD which has been successively doped by first and second impurity ions IP' and IP". Resistance pattern R2 is also doped with first and second impurity ions IP' and IP". Second impurity ions IP" are typically p-type.

Referring to FIGS. 1C and 1D, first photoresist pattern 120 is removed and spacers 135 are formed to cover the sidewalls of transfer gate electrode TG0, and resistance pattern R2. After forming spacers 135, a second photoresist pattern 140 having the same pattern as that of first photoresist pattern 120 is formed on semiconductor substrate 100. An edge portion 140' of second photoresist pattern 140, like edge portion 120' of first photoresist pattern 120, is disposed at the upper central portion of transfer gate electrode TG0/TG2.

Then, third impurity ions IP''' are implanted into semiconductor substrate 100 using second photoresist pattern 140 as an ion implantation mask. As a result, an n-type impurity region 145 is formed in the second portion of the active region and is separated from photodiode PD across transfer gate electrode TG0/TG3, where region TG3 of the transfer gate electrode has been successively doped with first, second, and third impurity ions IP', IP'', and IP'''. In addition, a resistance pattern R3 doped with first, second, and third impurity ions IP', IP'', and IP''' is formed in resistance area B. Third impurity ions IP''' are typically n-type impurity ions having a higher concentration density than that used in the first implantation of impurity ions IP'. N-type LDD impurity region 125, and $n^+$-type impurity region 145 constitute a floating diffusion region FD. Deep n-type impurity region NPD of photodiode PD, transfer gate electrode TG0/TG3, and floating diffusion region FD constitute a transfer transistor.

Since edge portion 140' of second photoresist pattern 140 is disposed at the upper central portion of transfer gate electrode TG0/TG3, the portion of transfer gate electrode TG0/TG3 covered by second photoresist pattern 140 (i.e., transfer gate electrode region TG0) remains undoped polysilicon. Thus, the driving capacity of the transfer transistor may be limited, because the undoped polysilicon portion of transfer gate electrode TG0 tends to reduce the electrical responsiveness of transfer gate electrode TG0/TG3.

It is true that second photoresist pattern 140 may be formed to expose the entire upper portion of transfer gate electrode TG0 in order to prevent this problem, but photoresist pattern misalignment problems may be generated. Consider, for example, the misalignment of photoresist pattern 140 shown by the alternate edge 140'' shown in FIG. 1D. Such a misalignment, results in a small portion of photodiode PD being doped by third impurity ions IP'''. As a result, an $n^+$-type tip region nT is formed within photodiode PD. Since $n^+$-type tip region nT comprises many stray electrons, these electrons will migrate into deep n-type impurity region NPD of photodiode PD. Thus, noise will be generated in photodiode PD due to increased dark level effects. That is, dark level effects increase because of the stray electrons provided by $n^+$-type tip region nT. Such dark level effects distort the sensitivity threshold of the photodiode PD.

A conventional method of fabricating an image sensor is disclosed, for example, in published U.S. Patent Application No. 2003/0173585 A1. In this disclosure, a transfer gate electrode is formed to intersect with an active region, and a first photoresist pattern is formed to expose a first end portion of the transfer gate electrode and a first portion of the active region adjacent to the first end portion of the transfer gate. Then, using the first photoresist pattern as an ion implantation mask, n-type and p-type impurities are sequentially implanted into the first portion of the active region, wherein the p-type impurities are implanted with a higher concentration than the n-type impurities, thereby forming a deep n-type impurity region and a shallow p-type impurity region of a photodiode. In this case, the transfer gate electrode exposed by the first photoresist pattern is doped with p-type impurities.

Then, the first photoresist pattern is removed, and a second photoresist pattern that does not cover a second portion of the active region is formed. The second portion of the active region is separated from the photodiode across at least some portion of the transfer gate electrode. Also, a second end portion of the transfer gate electrode is adjacent to the second portion of the active region. Then, using the second photoresist pattern as an ion implantation mask, n-type impurities are implanted into the second portion of the active region, thereby forming a floating diffusion region. At this time, the exposed transfer gate electrode is also doped with n-type impurities.

However, the respective portions of the transfer gate electrode exposed by the second photoresist pattern may be changed due to photoresist pattern misalignment problems. That is, since the various doped regions of a transfer gate electrode may be changed by misalignment errors, the electrical characteristics of the electrode depart from design specifications. Further, since one portion of a transfer gate electrode exposed by a first photoresist pattern may be doped with p-type impurities, a p-n junction may actually be formed within the transfer gate electrode itself. This result will clearly lead to deterioration in the electrical characteristics of the transfer gate electrode.

SUMMARY OF THE INVENTION

Therefore, embodiments of the invention provide an image sensor comprising a transfer gate electrode having a uniform impurity doping distribution, and methods of fabricating the same. Further, embodiments of the invention also provide an image sensor comprising a resistance pattern having a uniform impurity doping distribution, and methods of fabricating the same.

In one embodiment, the invention provides an image sensor comprising a semiconductor substrate. The semiconductor substrate comprises a pixel area, wherein the pixel area comprises an active region, and also comprises a transfer gate electrode that is disposed on the active region and has a uniform impurity doping distribution.

In another embodiment, the invention provides a method of fabricating an image sensor comprising preparing a semiconductor substrate, wherein the semiconductor substrate comprises a pixel area and a CMOS area, and wherein the CMOS area comprises an NMOS area and a PMOS area. The method further comprises forming an isolation layer in the semiconductor substrate to define active regions, forming a polysilicon layer on the semiconductor substrate, and forming an ion implantation mask pattern on the semiconductor substrate after forming the polysilicon layer, wherein the ion implantation mask pattern covers at least the PMOS area. The method still further comprises uniformly doping the polysilicon layer with n-type impurities through the ion implantation mask pattern, removing the ion implantation mask pattern, and thereafter patterning the polysilicon layer to form a transfer gate electrode on the pixel area, an NMOS gate electrode on the NMOS area, and a PMOS gate electrode on the PMOS area.

In yet another embodiment, the invention provides a method of fabricating an image sensor comprising preparing a semiconductor substrate, wherein the semiconductor substrate comprises a resistance area and a CMOS area, and wherein the CMOS area comprises an NMOS area and a PMOS area. The method further comprises forming an isolation layer in the semiconductor substrate to define active regions, forming a polysilicon layer on the semiconductor substrate, and forming an ion implantation mask pattern on the semiconductor substrate after forming the polysilicon layer, wherein the ion implantation mask pattern covers at least the PMOS area. The method still further comprises uniformly doping the polysilicon layer with n-type impurities through the ion implantation mask pattern, removing the ion implantation mask pattern, and thereafter patterning the polysilicon layer to form a resistance pattern on the resistance area, an NMOS gate electrode on the NMOS area, and a PMOS gate electrode on the PMOS area.

BRIEF DESCRIPTION OF THE DRAWINGS

Exemplary embodiments of the present invention will be described in detail with reference to the accompanying drawings, in which the thicknesses of layers and regions are exaggerated for clarity, and like reference symbols refer to like or similar elements. In the drawings:

FIGS. 1A through 1D are cross-sectional views illustrating a conventional method of fabricating an image sensor;

DESCRIPTION OF EXEMPLARY EMBODIMENTS

As used herein, when a first element is described as being "on" a second element, the first element may be directly on the second element, or intervening elements may be present between the first and second elements. However, when a first element is described as being "directly on" a second element, no intervening elements may be present.

Also, as used herein, whenever an element or region of an element is doped with impurity ions, the doping is performed substantially uniformly (i.e., the impurities are doped into the element or region with a substantially uniform density). As used herein, the designations "n$^+$-type" and "p$^+$-type" in relation to impurity ions indicate respective impurity concentrations relatively greater than the corresponding terms "n-type" and "p-type".

In addition, as used herein, the term "horizontal" indicates a direction substantially parallel with the major working surface of the substrate within the illustrated embodiments. Also, those of ordinary skill in the art will recognize that the patterns, regions, and/or elements described in relation to the exemplary embodiments may be formed using one or more conventional techniques.

Figure 2A:
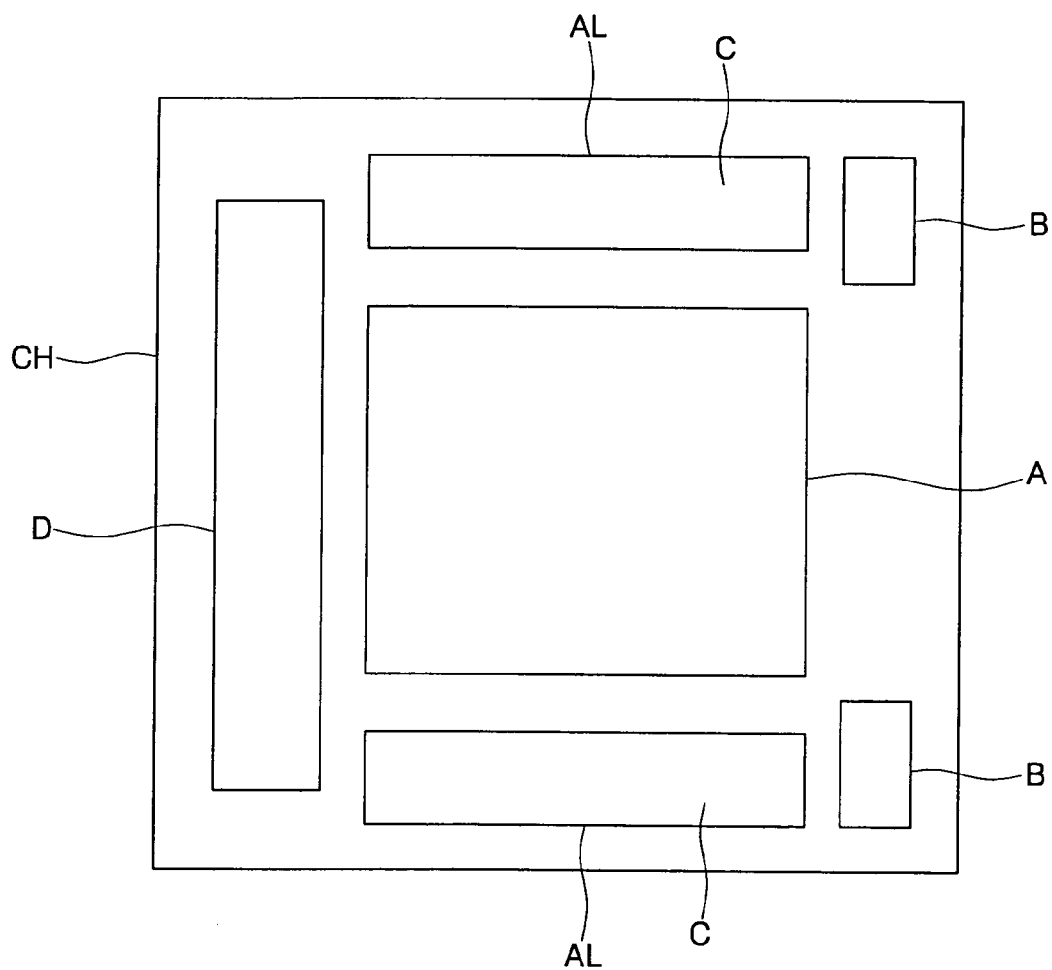
FIG. 2A is a schematic block diagram illustrating an image sensor chip in accordance with an exemplary embodiment of the present invention.

FIG. 2A is a schematic block diagram illustrating an image sensor chip in accordance with an exemplary embodiment of the present invention.

In the illustrated example shown in FIG. 2A, an image sensor chip CH in accordance with an exemplary embodiment of the present invention comprises a main pixel array area A. Main pixel array area A comprises a plurality of main pixels, which are aligned two-dimensionally along rows and columns. The main pixels comprise photodiodes that react with incident light to generate electrical charge. Main pixel array area A will be referred to herein as pixel area A. In the illustrated example, a peripheral circuit area is disposed surrounding main pixel array area A. The peripheral circuit area comprises an analog circuit area AL, a resistance area B, and a digital circuit area D. Analog circuit area AL comprises a CMOS area C. CMOS area C comprises an NMOS area and a PMOS area. Resistance area B comprises a resistance pattern. As incident light impacts the photodiodes of the main pixels, the photodiodes accumulate electrical charge, and the accumulated charge is moved to the peripheral circuit area through corresponding transfer transistors. The accumulated electrical charge is converted into coherent data using one of several conventional techniques, and the data is thereafter sampled to generate a representative electrical signal. The electrical signal is then amplified through resistance area B. The amplified electrical signal is then stored as a digital signal in digital circuit area D through analog circuit area AL.

Figure 2B:
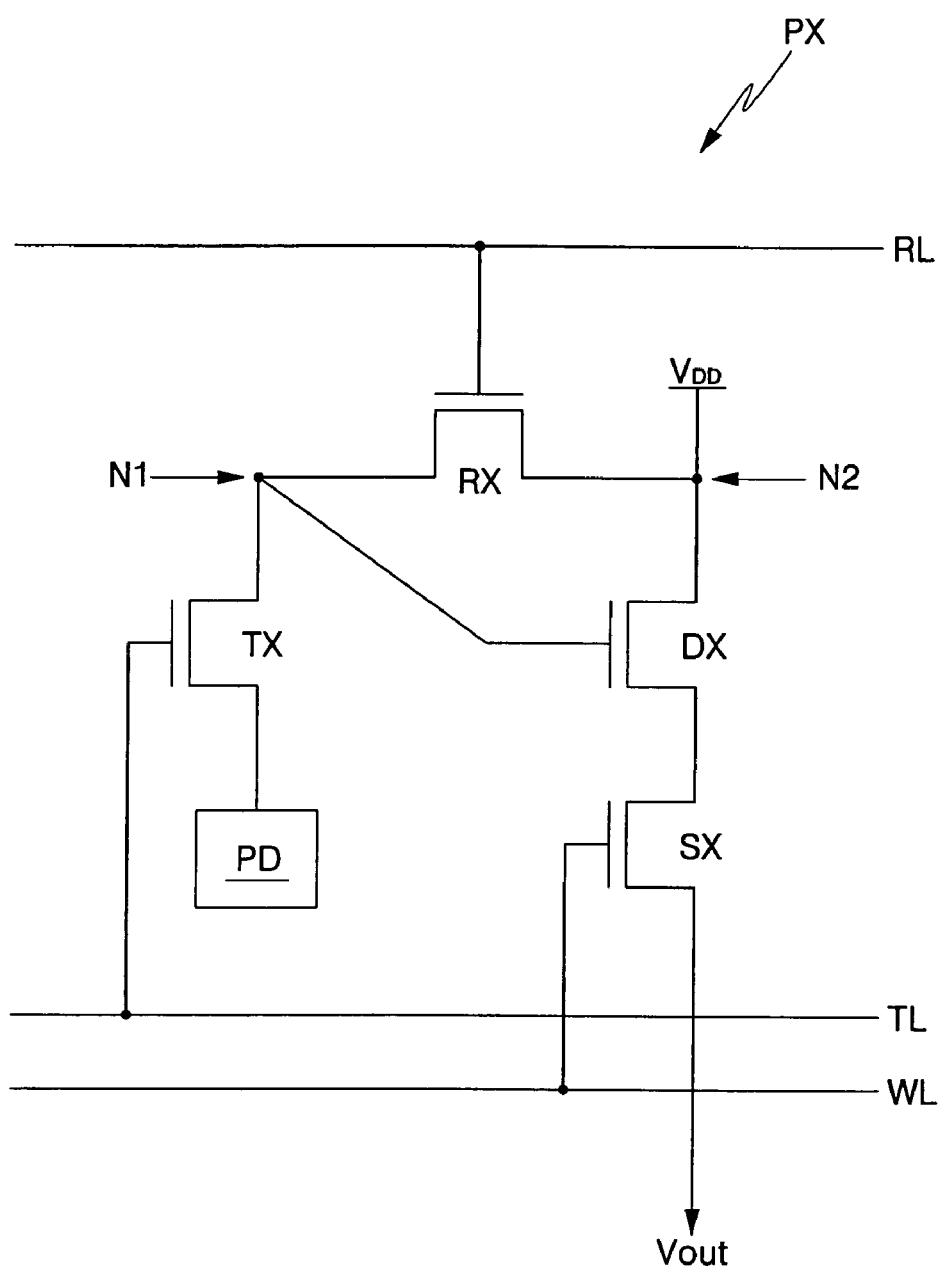
FIG. 2B is an equivalent circuit diagram for a typical unit pixel of a main pixel array area A of FIG. 2A.

FIG. 2B is an equivalent circuit diagram for an exemplary unit pixel of the main pixel array area A shown in FIG. 2A.

In the illustrated example shown in FIG. 2B, a typical unit pixel PX comprises a photodiode PD comprising a shallow p-type impurity region and a deep n-type impurity region. Further, unit pixel PX comprises a transfer transistor TX, a reset transistor RX, a drive transistor DX, and a select transistor SX, which are each connected in series to photodiode PD. A first node N1 disposed between transfer transistor TX and reset transistor RX is connected to a gate electrode of drive transistor DX. Further, a second node N2 disposed between reset transistor RX and drive transistor DX is connected to a power source VDD. Transfer transistor TX, reset transistor RX, drive transistor DX, and select transistor SX may be all NMOS transistors. In the illustrated example, the deep n-type impurity region of photodiode PD is a source region of transfer transistor TX.

A gate electrode of transfer transistor TX is electrically connected to a transfer line TL, and a gate electrode of select transistor SX is electrically connected to a word line WL. Further, a gate electrode of reset transistor RX is electrically connected to a reset line RL.

An exemplary method of outputting data of unit pixel PX shown in FIG. 2B will now be described.

Referring to FIG. 2B, a voltage of a logic high level (i.e., logic "1") is applied to reset line RL to turn on reset transistor RX. As a result, charge at first node N1, that is, the floating diffusion region of unit pixel PX, is completely transferred. Thus, unit pixel PX is initialized. Then, reset transistor RX is turned off. If incident light is then irradiated on photodiode PD of initialized unit pixel PX, charge is developed from the deep n-type impurity region of photodiode PD.

A logic high level voltage is applied to transfer line TL and word line WL to generate an output signal corresponding to the incident light. As a result, transfer transistor TX and select transistor SX are turned on, and charge from the deep n-type impurity region of photodiode PD are injected into first node N1. The drive current for drive transistor DX is determined in response to the quantity of charge injected into first node N1, and an output voltage Vout is provided to an output terminal of select transistor SX. As a result, output voltage Vout of unit pixel PX is determined in accordance with the intensity of the incident light irradiated on photodiode PD.

Figure 3:
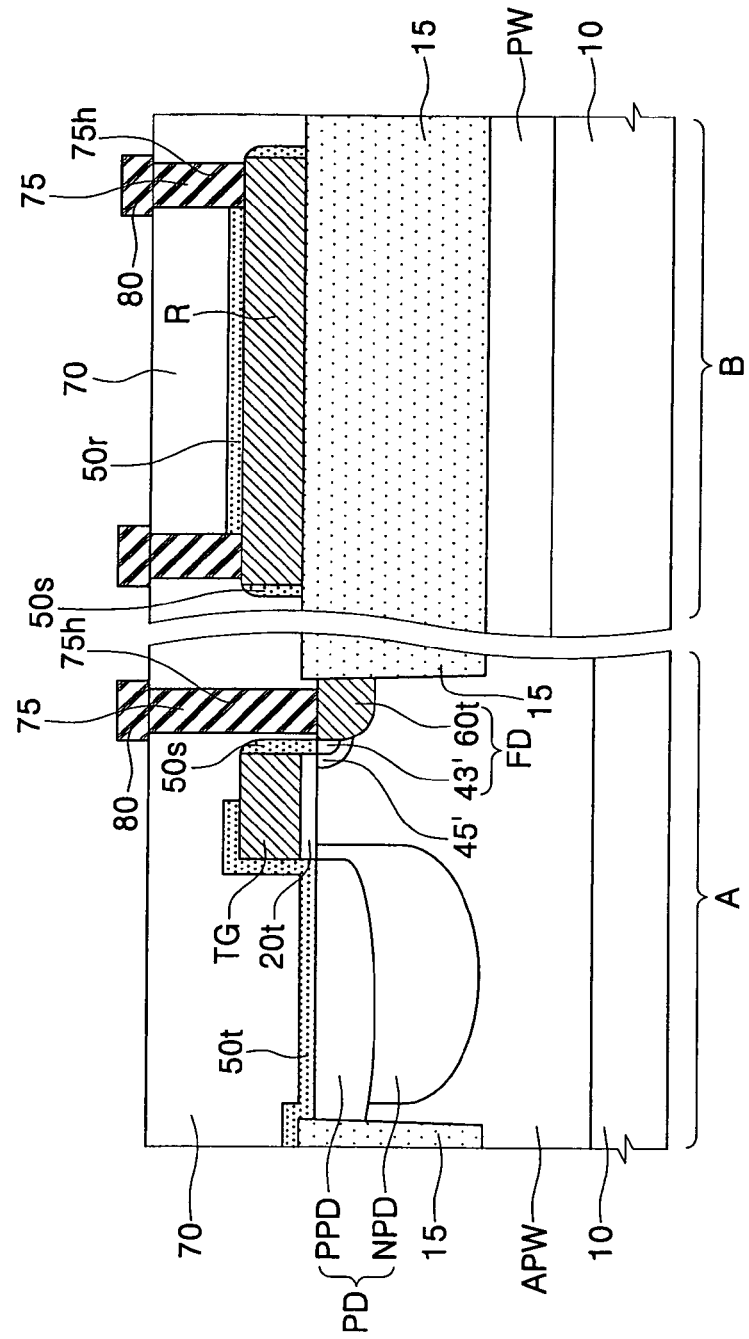
FIG. 3 is a cross-sectional view illustrating an image sensor in accordance with an exemplary embodiment of the present invention.

FIG. 3 is a cross-sectional view illustrating an image sensor in accordance with an exemplary embodiment of the present invention. The reference symbols "A" and "B" refer to main pixel array area (pixel area) A and resistance area B of FIG. 2A, respectively.

In the illustrated example of shown in FIG. 3, a semiconductor substrate 10 comprises a pixel area A and a resistance area B. A first p-type well APW is disposed in semiconductor substrate 10 at pixel area A. A second p-type well PW is disposed in semiconductor substrate 10 at resistance area B, and first p-type well APW is disposed more deeply in semiconductor substrate 10 than second p-type well PW. Active regions defined by isolation layer 15 are disposed in semiconductor substrate 10 (i.e., active regions are disposed in semiconductor substrate 10 between portions of isolation layer 15). In addition, resistance area B of semiconductor substrate 10 is completely covered by isolation layer 15.

Figure 1B:
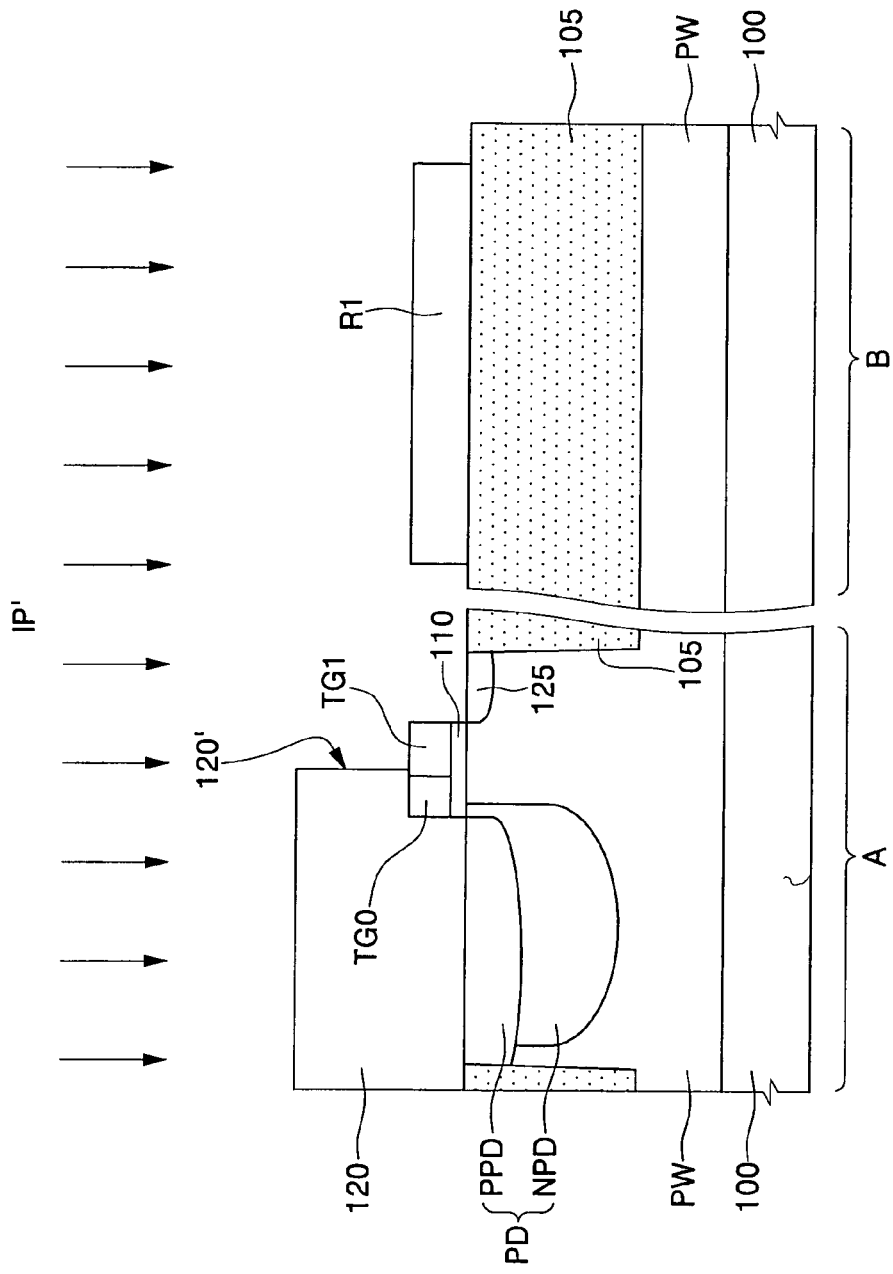
Figure 1C:
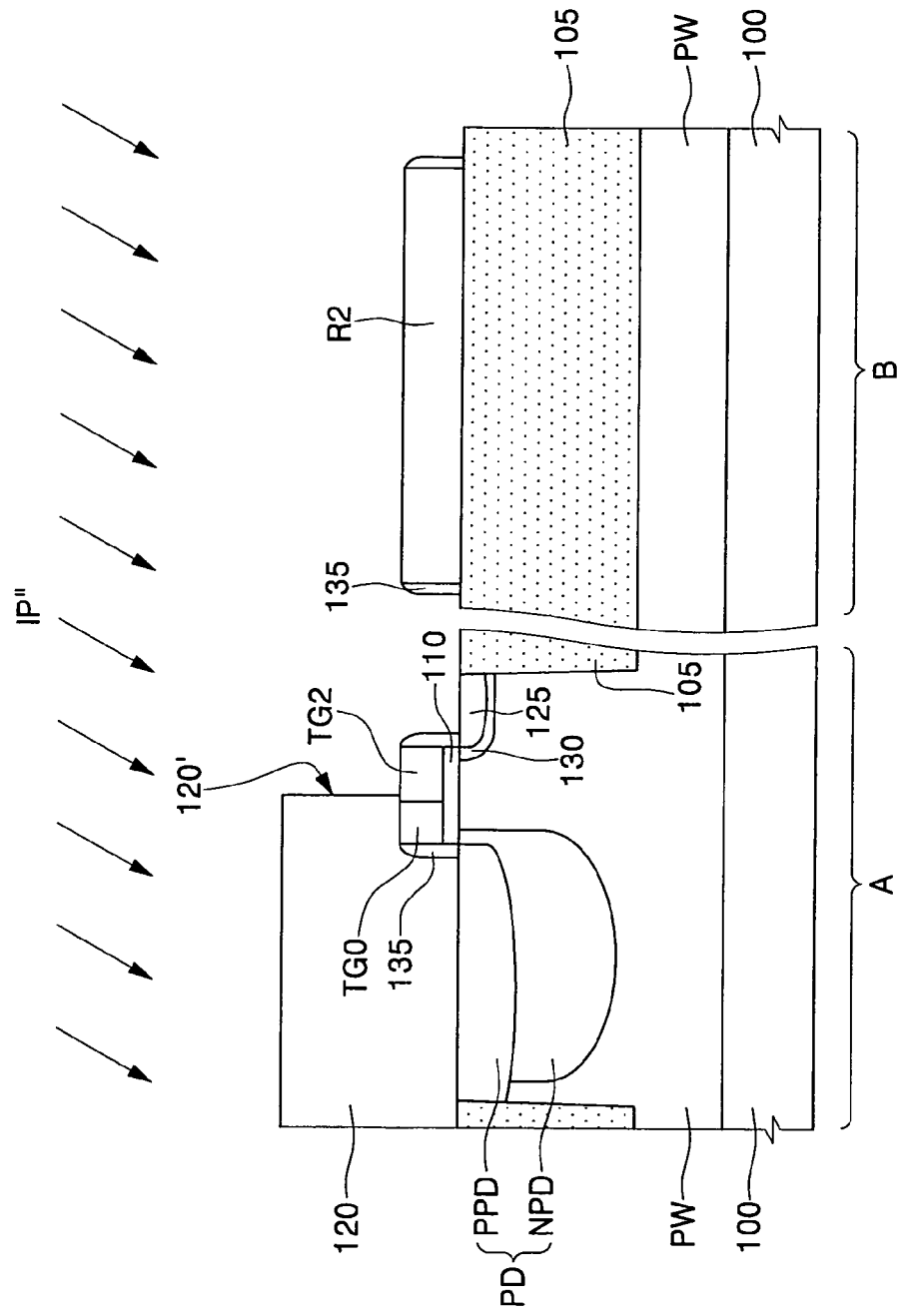
Figure 1D:
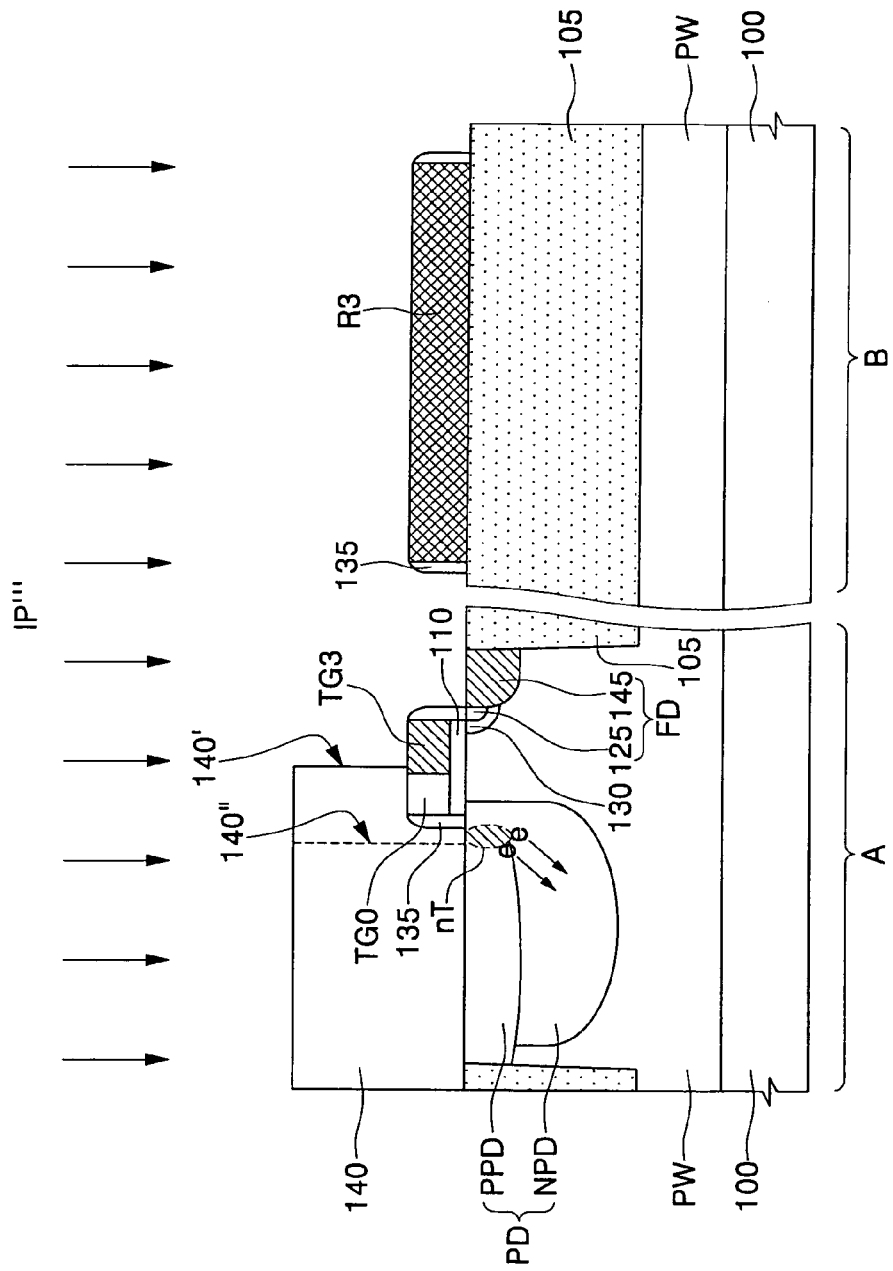

A transfer gate electrode TG is disposed on pixel area A of semiconductor substrate 10, intersects with the active region, and has a uniform impurity doping distribution. Transfer gate electrode TG has a substantially uniform impurity doping distribution in the horizontal direction. Transfer gate electrode TG also has a more uniform impurity doping distribution than that of conventional transfer gate electrode TG0, TG3 shown in FIG. 1D. Transfer gate electrode TG is doped with n-type impurities in the illustrated example.

A transfer gate insulating layer 20t is disposed between transfer gate electrode TG and an active region of pixel area A. A photodiode PD is disposed in the active region of pixel area A at a first side of transfer gate electrode TG. Photodiode PD comprises a shallow p-type impurity region PPD and a deep n-type impurity region NPD disposed below shallow p-type impurity region PPD.

A floating diffusion region FD is disposed in the active region of pixel area A and is separated from photodiode PD with at least a portion of transfer gate electrode TG disposed between floating diffusion region FD and photodiode PD. Floating diffusion region FD comprises an LDD n-type impurity region 43' and an $n^+$-type impurity region 60t. A shallow p-type impurity region 45' is disposed in the active region of pixel area A and adjacent to LDD n-type impurity region 43'. $N^+$-type impurity region 60t of floating diffusion region FD has a higher density of impurity ions than deep n-type impurity region NPD of photodiode PD.

In the illustrated example, a resistance pattern R having a substantially uniform impurity doping distribution is disposed on isolation layer 15 of resistance area B. Resistance pattern R has a substantially uniform impurity doping distribution in the horizontal direction. A transfer spacer pattern 50t is disposed to cover an upper portion of photodiode PD of pixel area A, a first sidewall of transfer gate electrode TG, and a portion of the upper portion of transfer gate electrode TG. Spacers 50s are disposed to cover a second sidewall of transfer gate electrode TG adjacent to floating diffusion region FD, and to cover the sidewalls of resistance pattern R. A resistance spacer pattern 50r is disposed to cover a central portion of resistance pattern R of resistance area B while exposing first and second end portions of resistance pattern R. Transfer spacer pattern 50t, spacers 50s, and resistance spacer pattern 50r may be formed from silicon nitride, for example.

An interlayer insulating layer 70 is disposed on semiconductor substrate 10, on which spacer patterns 50t and 50r, and spacers 50s are formed. Contact holes 75h may penetrate interlayer insulating layer 70 and expose at least portions of each of first and second end portions of resistance pattern R and at least a portion of floating diffusion region FD. Contact plugs 75 may be disposed to fill contact holes 75h. Upper metal interconnections 80 may be disposed on semiconductor substrate 10, on which contact plugs 75 are formed, and electrically connected to contact plugs 75.

FIGS. 4A through 4F are cross-sectional views illustrating an exemplary method of fabricating an image sensor in accordance with an exemplary embodiment of the present invention. Reference symbols "A," "B," and "C" of FIGS. 4A through 4F refer to main pixel array area (pixel area) A, resistance area B, and CMOS area C of analog circuit area AL of FIG. 2A, respectively. CMOS area C of FIGS. 4A through 4F comprises a PMOS area C' and an NMOS area C".

Figure 4A:
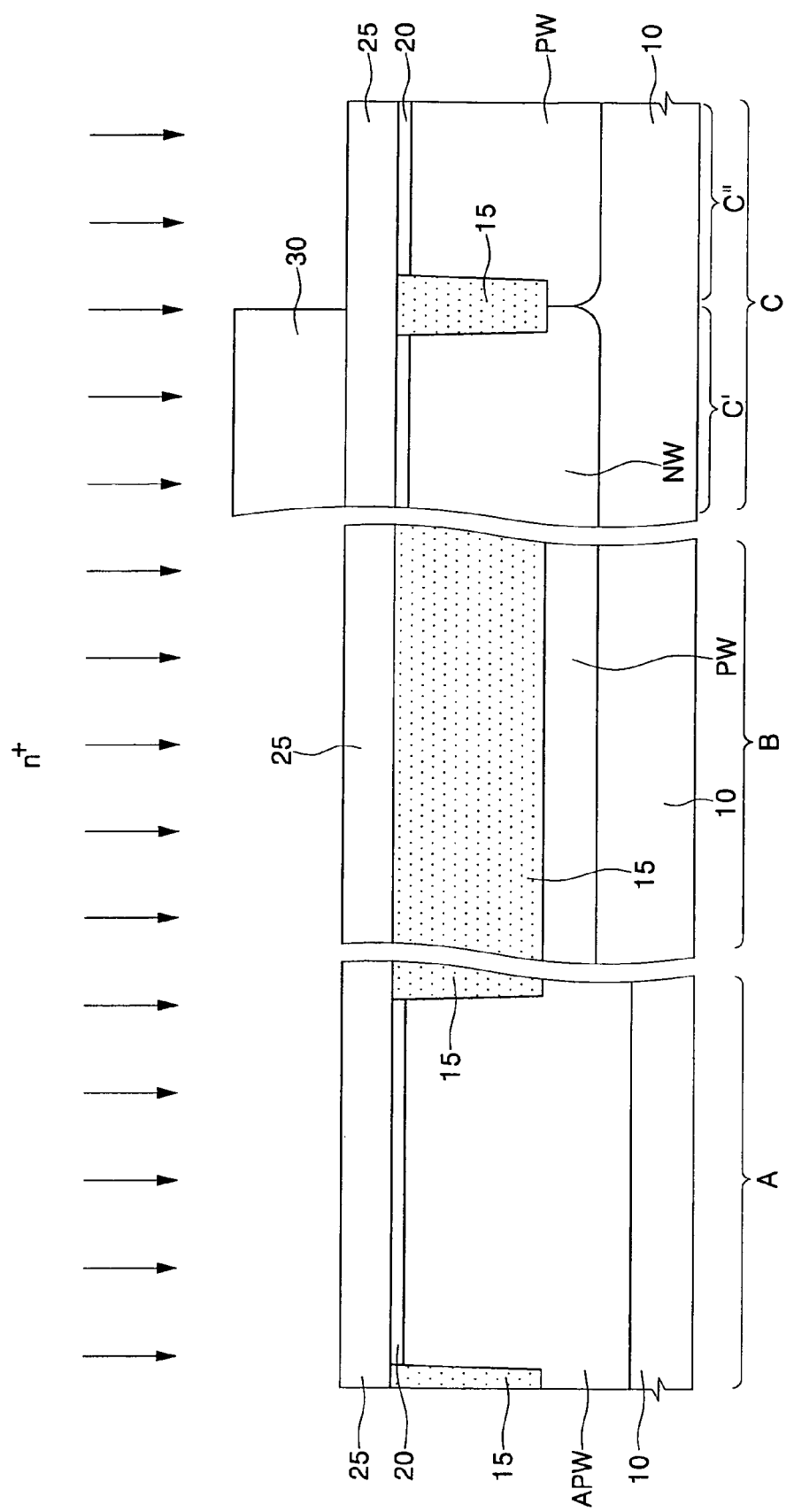
FIGS. 4A through 4F are cross-sectional views illustrating an exemplary method of fabricating an image sensor in accordance with an exemplary embodiment of the present invention; and, FIGS. 5A and 5B are cross-sectional views illustrating an exemplary method of fabricating an image sensor in accordance with another exemplary embodiment of the present invention.

In the illustrated exemplary method, as shown in FIG. 4A, impurity ions are implanted into semiconductor substrate 10 to form a first p-type well APW in pixel area A and a second p-type well PW in NMOS area C". Further, an n-type well NW is formed in PMOS region C'. First p-type well APW is formed more deeply into semiconductor substrate 10 than second p-type well PW. After forming first and second p-type wells APW and PW, and n-type well NW, isolation layer 15 is formed on semiconductor substrate 10 to define active regions of semiconductor substrate 10. Isolation layer 15 is formed to cover all of semiconductor substrate 10 at resistance region B.

Then, a gate insulating layer 20 is formed on the active regions of semiconductor substrate 10. Gate insulating layer 20 may be formed using a thermal oxidation process. Also, gate insulating layer 20 may be formed from an oxide layer, for example. After forming gate insulating layer 20, a polysilicon layer 25 is formed on semiconductor substrate 10. Gate electrodes will subsequently be formed on semiconductor substrate 10 from polysilicon layer 25. To form gate electrodes that are highly integrated but also maintain excellent electrical characteristics, a gate electrode of the PMOS area must be doped with $p^+$-type impurities and a gate electrode of the NMOS area must be doped with $n^+$-type impurities. Thus, polysilicon layer 25 is formed from undoped polysilicon.

After polysilicon layer 25 is formed, an ion implantation mask pattern 30 is formed on semiconductor substrate 10 covering PMOS region C'. Ion implantation mask pattern 30 may be a photoresist pattern or a hard mask pattern. After forming implantation mask pattern 30, polysilicon layer 25 is doped with $n^+$-type impurities having a substantially uniform density using ion implantation mask pattern 30 as a mask.

Figure 4B:
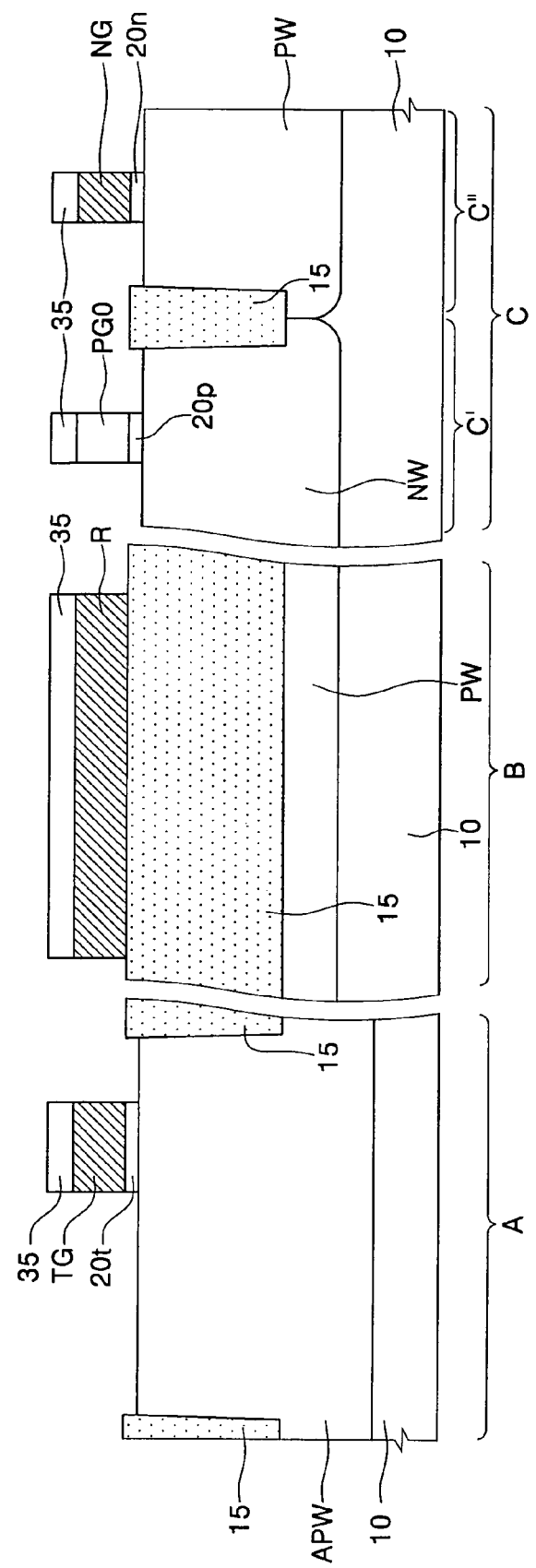

In the illustrated exemplary method, as shown in FIGS. 4A and 4B, after portions of polysilicon layer 25 are doped with $n^+$-type impurities, ion implantation mask pattern 30 is removed. After ion implantation mask pattern 30 is removed, a mask layer is formed on semiconductor substrate 10. Then, the mask layer and polysilicon layer 25 are sequentially patterned. As a result, a transfer gate electrode TG doped with $n^+$-type impurities is formed on semiconductor substrate 10 at pixel area A, a resistance pattern R doped with $n^+$-type impurities is formed on isolation layer 15 at resistance area B, an NMOS gate electrode NG doped with $n^+$-type impurities is formed on semiconductor substrate 10 at NMOS area C", and a PMOS gate electrode PG0 is formed on semiconductor substrate 10 at PMOS area C'. Also as a result, a mask pattern 35 is formed on each of the following: transfer gate electrode TG, resistance pattern R, NMOS gate electrode NG, and PMOS gate electrode PG0. Since the portion of polysilicon layer 25 from which PMOS gate electrode PG0 was formed was covered by ion implantation mask pattern 30 when n-type impurities were implanted into polysilicon layer 25, PMOS gate electrode PG0 is formed of an undoped polysilicon pattern.

When the mask layer and polysilicon layer 25 are sequentially patterned, gate insulating layer 20 may be patterned concurrently. Thus, a transfer gate insulating layer 20t may be formed below transfer gate electrode TG, an NMOS gate insulating layer 20n may be formed below NMOS gate electrode NG, and a PMOS gate insulating layer 20p may be formed below PMOS gate electrode PG0.

Figure 4C:
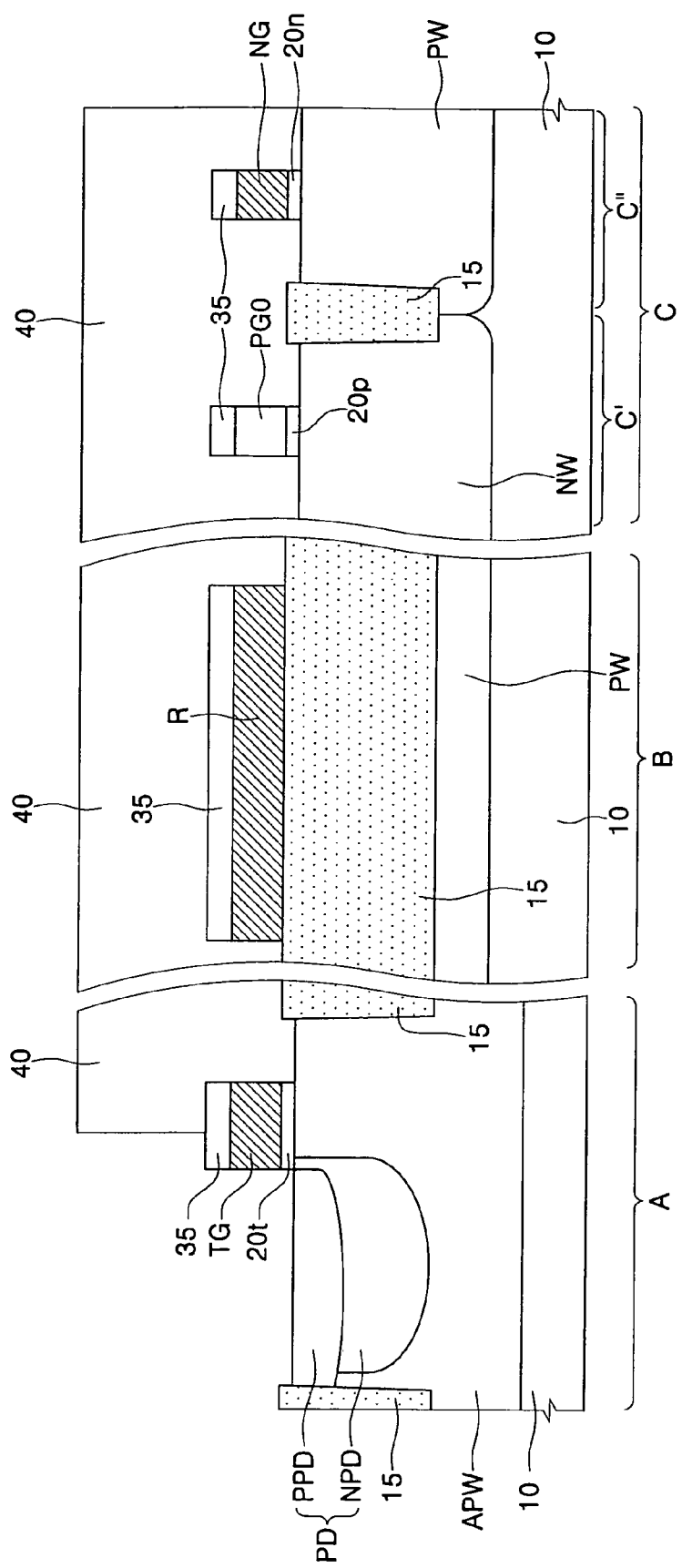

In the illustrated exemplary method, as shown in FIG. 4C, after forming resistance pattern R and gate electrodes TG, PG0, and NG, a photodiode photoresist pattern 40 is formed on semiconductor substrate 10. The "photodiode photoresist pattern" 40 is characterized by exposing at least a photodiode region of semiconductor substrate 10. The "photodiode region" is characterized by comprising a portion of the active region of pixel area A disposed at a first side of transfer gate electrode TG. As used herein, being "disposed at" a side of a gate electrode may include being disposed at least partially under the gate electrode. A deep n-type impurity region NPD and a shallow p-type impurity region PPD are formed in the photodiode region using photodiode photoresist pattern 40 as an ion implantation mask, thereby forming a photodiode PD. During the formation of photodiode PD, an edge portion of photodiode photoresist pattern 40 may be disposed at a central portion of mask pattern 35 on transfer gate electrode TG. However, since transfer gate electrode TG is covered by mask pattern 35, transfer gate electrode TG is not doped with impurity ions during the formation of photodiode PD.

Figure 4D:
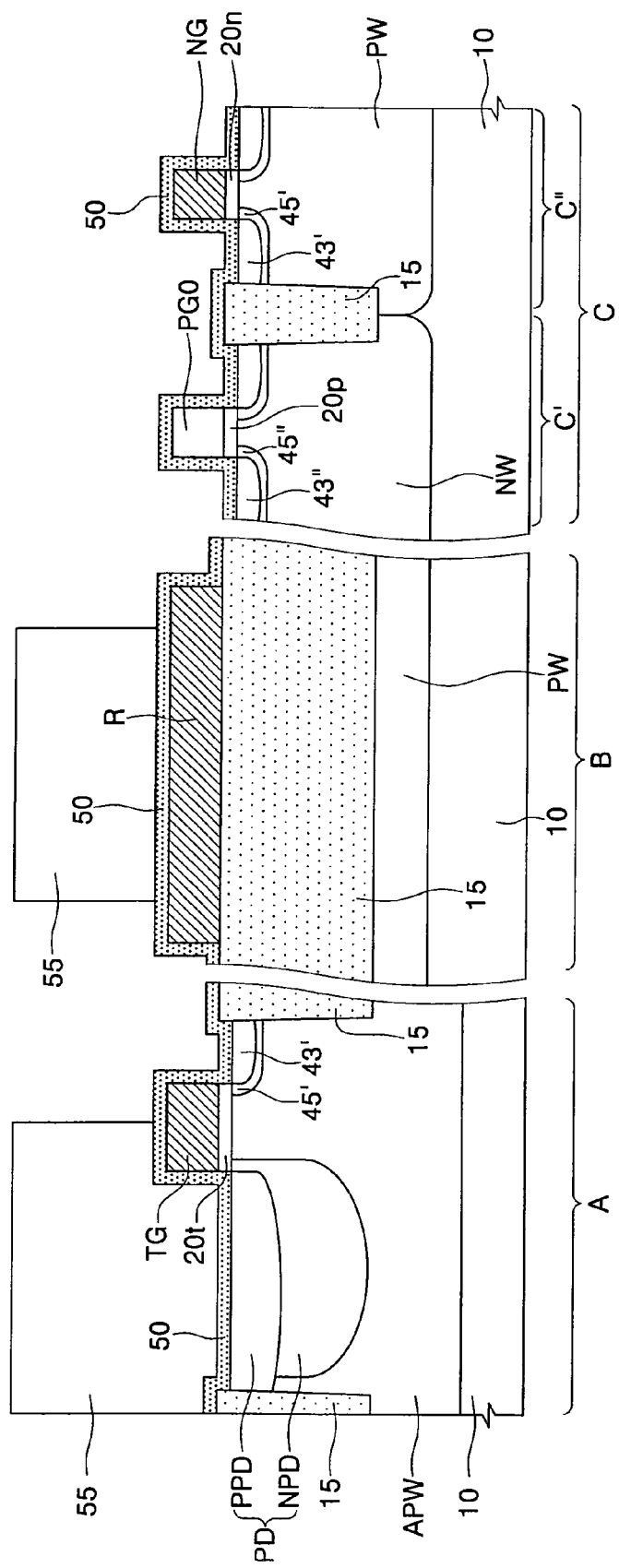

In the illustrated exemplary method, as shown in FIGS. 4C and 4D, photodiode photoresist pattern 40 is then removed. Then, mask patterns 35 are removed. A first LDD n-type impurity region 43' is formed in an impurity deposition region of the active region of pixel area A. The "impurity deposition region" is characterized by comprising a portion of the active region of pixel area A disposed at a second side of transfer gate electrode TG and separated from the photodiode region, wherein at least a portion of transfer gate electrode TG is disposed between the photodiode region and the impurity deposition region. Thus, the first LDD n-type impurity region 43' is separated from photodiode PD, and at least a portion of transfer gate electrode TG is disposed between first LDD n-type impurity region 43' and photodiode PD. Also, second LDD n-type impurity regions 43' are formed in an active region of NMOS area C" at both sides of NMOS gate electrode NG. Then, using a tilt ion implantation method, a shallow p-type impurity region 45' is formed in the impurity deposition region. Thus, shallow p-type impurity region 45' is separated from photodiode PD and at least a portion of transfer gate electrode TG is disposed between shallow p-type impurity region 45' and photodiode PD. Also, shallow p-type impurity regions 45' are formed in the active region of NMOS area C" at both sides of NMOS gate electrode NG using a tilt ion implantation method.

Then, LDD p-type impurity regions 43" and shallow n-type impurity regions 45" are formed in the active region of PMOS area C' at both sides of PMOS gate electrode PG0. Shallow n-type impurity regions 45" are formed using a tilt ion implantation method. Shallow impurity regions 45' and 45" are formed to prevent a short channel effect. Thus, shallow impurity regions 45' each have a conductivity type opposite that of LDD impurity regions 43', and shallow impurity regions 45" each have a conductivity type opposite that of LDD impurity regions 43". When LDD and shallow impurity regions 43', 43", 45', and 45" are formed, resistance pattern R of resistance area B is covered with a photoresist pattern (though different photoresist patterns may cover resistance pattern R over the course of the process of forming those impurity regions).

After LDD and shallow impurity regions 43', 43", 45', and 45" are formed, spacer layer 50 is formed on semiconductor substrate 10 such that it conforms to the surface of semiconductor substrate 10. Spacer layer 50 may be formed from a silicon nitride layer. After forming spacer layer 50, a block photoresist pattern 55 is formed on semiconductor substrate 10. The "block photoresist pattern" 55 is characterized by exposing at least the impurity deposition region, CMOS area C, and both end portions of resistance pattern R.

Figure 4E:
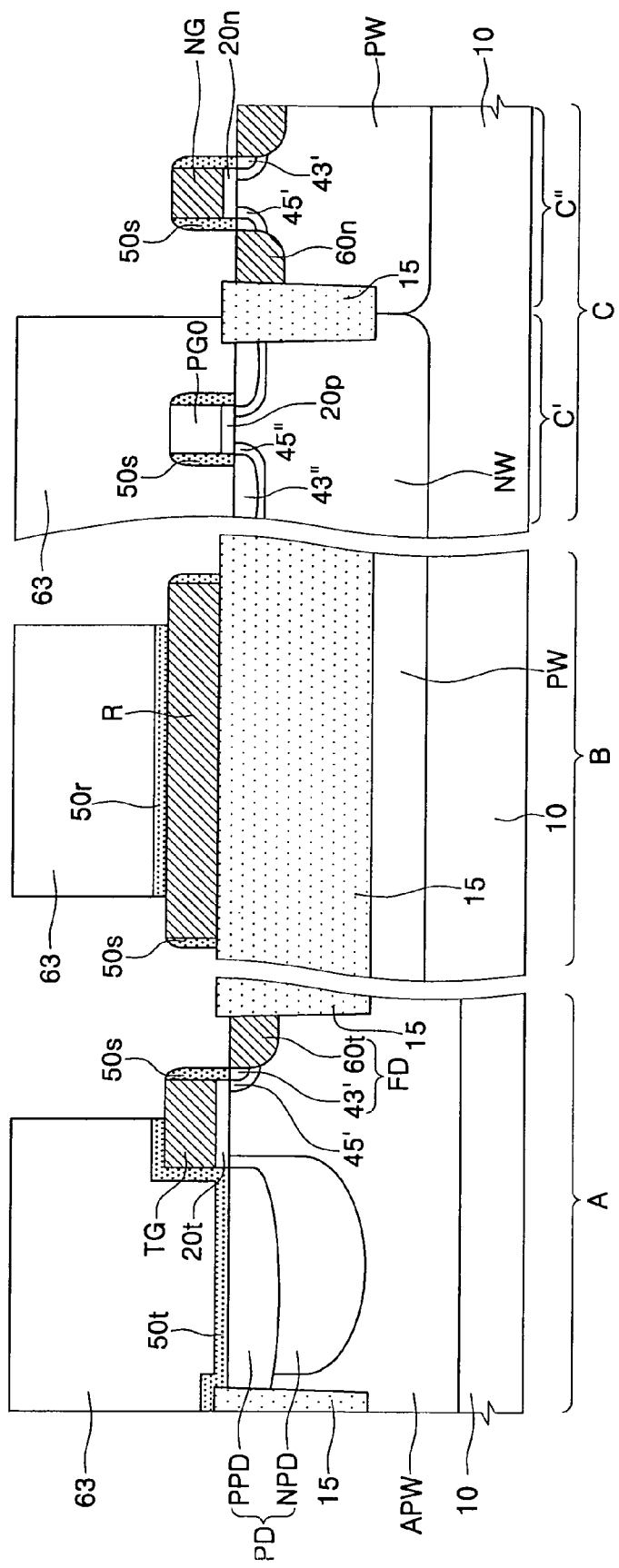

In the illustrated exemplary method, as shown in FIGS. 4D and 4E, spacer layer 50 is etched using block photoresist pattern 55 as an etch mask, thereby forming spacers 50s on the sidewalls of NMOS gate electrode NG, the sidewalls of PMOS gate electrode PG0, a second sidewall of transfer gate electrode TG (i.e., the sidewall disposed on the second side of transfer gate electrode TG), and the sidewalls of resistance pattern R. Concurrently, a resistance spacer pattern 50r is formed on resistance pattern R, and a transfer spacer pattern 50t is formed to cover the upper portion of photodiode PD, a first sidewall of transfer gate electrode TG (i.e., the sidewall disposed on the first side of transfer gate electrode TG), and a first upper portion of transfer gate electrode TG, which extends from top of the first sidewall of transfer gate electrode TG to the central upper portion thereof. Block photoresist pattern 55 is then removed.

After spacers 50s, and spacer patterns 50t and 50r are formed, a floating diffusion photoresist pattern 63 is formed on semiconductor substrate 10. The "floating diffusion photoresist pattern" 63 is characterized by exposing at least the impurity deposition region, NMOS area C", and both end portions of resistance pattern R.

Then, $n^+$-type impurity ions are implanted into semiconductor substrate 10 using floating diffusion photoresist pattern 63 as an ion implantation mask. As a result, $n^+$-type source/drain regions 60n are formed in the active region of NMOS area C", and an $n^+$-type impurity region 60t is formed in the impurity deposition region. LDD n-type impurity region 43' of pixel area A and $n^+$-type impurity region 60t constitute a floating diffusion region FD. Alternatively, if spacer patterns 50t and 50r are formed with a thickness sufficient to mask the implantation energy of the $n^+$-type impurity ions, floating diffusion photoresist pattern 63 may be formed to cover only PMOS region C'.

An edge portion of floating diffusion photoresist pattern 63 may be disposed on the upper central portion of transfer gate electrode TG, thus exposing the second side of transfer gate electrode TG. So, a portion of transfer gate electrode TG may be doped with $n^+$-type impurity ions (i.e., undergo a second doping) when $n^+$-type impurity ions are implanted into semiconductor substrate 10 to form region 60t. However, transfer gate electrode TG was, in effect, already doped with n-type impurity ions when polysilicon layer 25 (of FIG. 4A) was doped (i.e., a first doping), as described with reference to FIG. 4A. So, the second doping of transfer gate electrode TG with n-type impurity ions does not change the electrical characteristics of transfer gate electrode TG because the impurity ions used in both the first doping and the second doping of transfer gate electrode TG have the same conductivity type (i.e., n-type impurity ions were used in both dopings). In addition, deep n-type impurity region NPD of photodiode PD, transfer gate electrode TG, and floating diffusion region FD constitute a transfer transistor TX.

Further, both end portions of resistance pattern R exposed by floating diffusion photoresist pattern 63 are doped with $n^+$-type impurity ions when $n^+$-type impurity ions are implanted into semiconductor substrate 10 to form region 60t. Doping both end portions of resistance pattern R with $n^+$-type impurity ions when $n^+$-type impurity ions are implanted into semiconductor substrate 10 to form region 60t can reduce contact resistance at both end portions of resistance pattern R, which is where contacts will subsequently be formed. However, a substantial resistance portion of resistance pattern R is covered by floating diffusion photoresist pattern 63 and/or resistance spacer pattern 50r, so floating diffusion photoresist pattern 63 and/or resistance spacer pattern 50r prevent $n^+$-type impurity ions from being implanted into the covered portion of resistance pattern R. Thus, since the substantial resistance portion of resistance pattern R is doped with $n^+$-type impurity ions only once, which is when polysilicon layer 25 (of FIG. 4A) is doped, as described with reference to FIG. 4A, the resistance characteristics of resistance pattern R can be controlled easily.

Figure 4F:
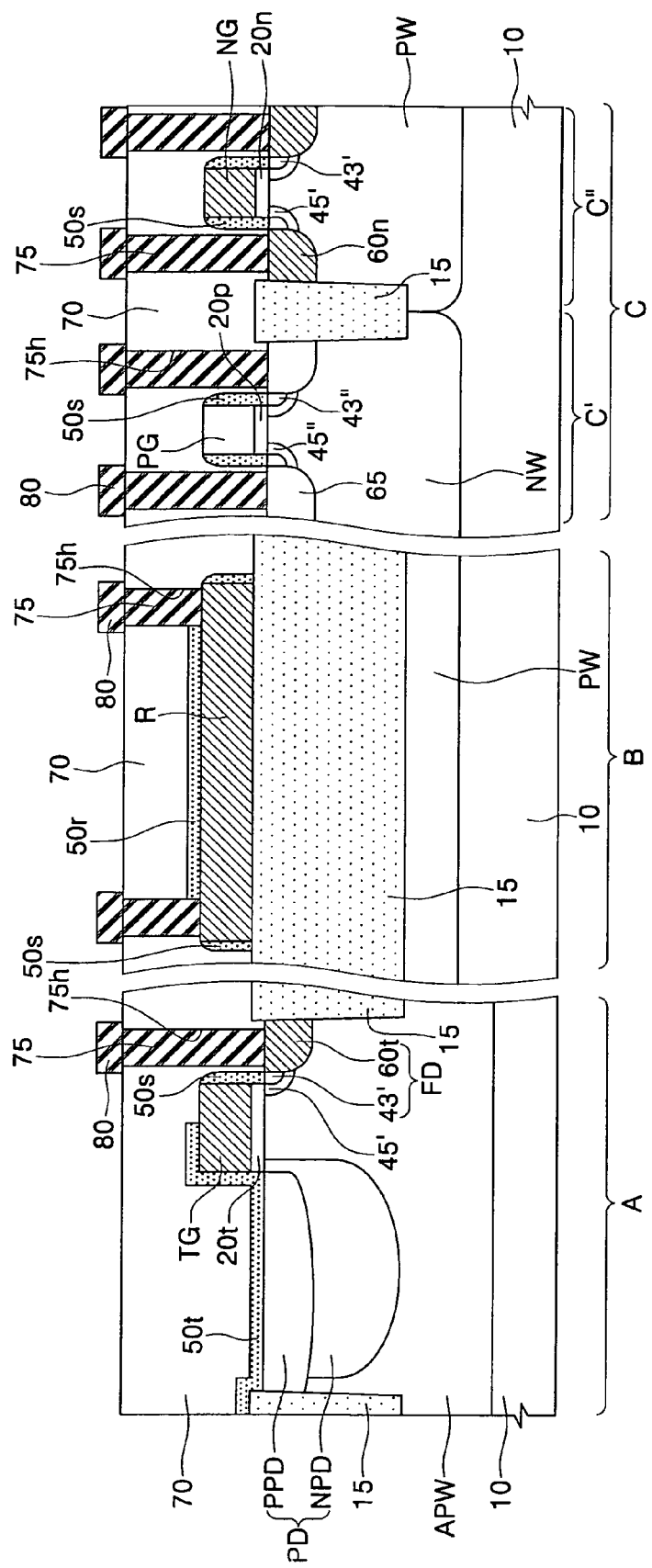

In the illustrated exemplary method, as shown in FIGS. 4E and 4F, floating diffusion photoresist pattern 63 is removed. Then, a PMOS photoresist pattern (not shown) is formed. The "PMOS photoresist pattern" is characterized by exposing only PMOS region C'. Using the PMOS photoresist pattern as an ion implantation mask, p+-type impurity ions are implanted into semiconductor substrate 10, thereby forming p+-type source/drain regions 65 and forming a PMOS gate electrode PG doped with p+-type impurity ions.

Then, the PMOS photoresist pattern is removed, and an interlayer insulating layer 70 is formed on semiconductor substrate 10. Contact holes 75h are formed to penetrate interlayer insulating layer 70 and expose floating diffusion region FD, both end portions of resistance pattern R, n+-type source/drain regions 60n, and p+-type source/drain regions 65. Then, an upper metal layer (not shown) may be formed on semiconductor substrate 10 to fill contact holes 75h and cover interlayer insulating layer 70. The upper metal layer is then patterned, thereby forming contact plugs 75 inside contact holes 75h, and forming upper metal interconnections 80, each of which is electrically connected to a contact plug 75.

Figure 5A:
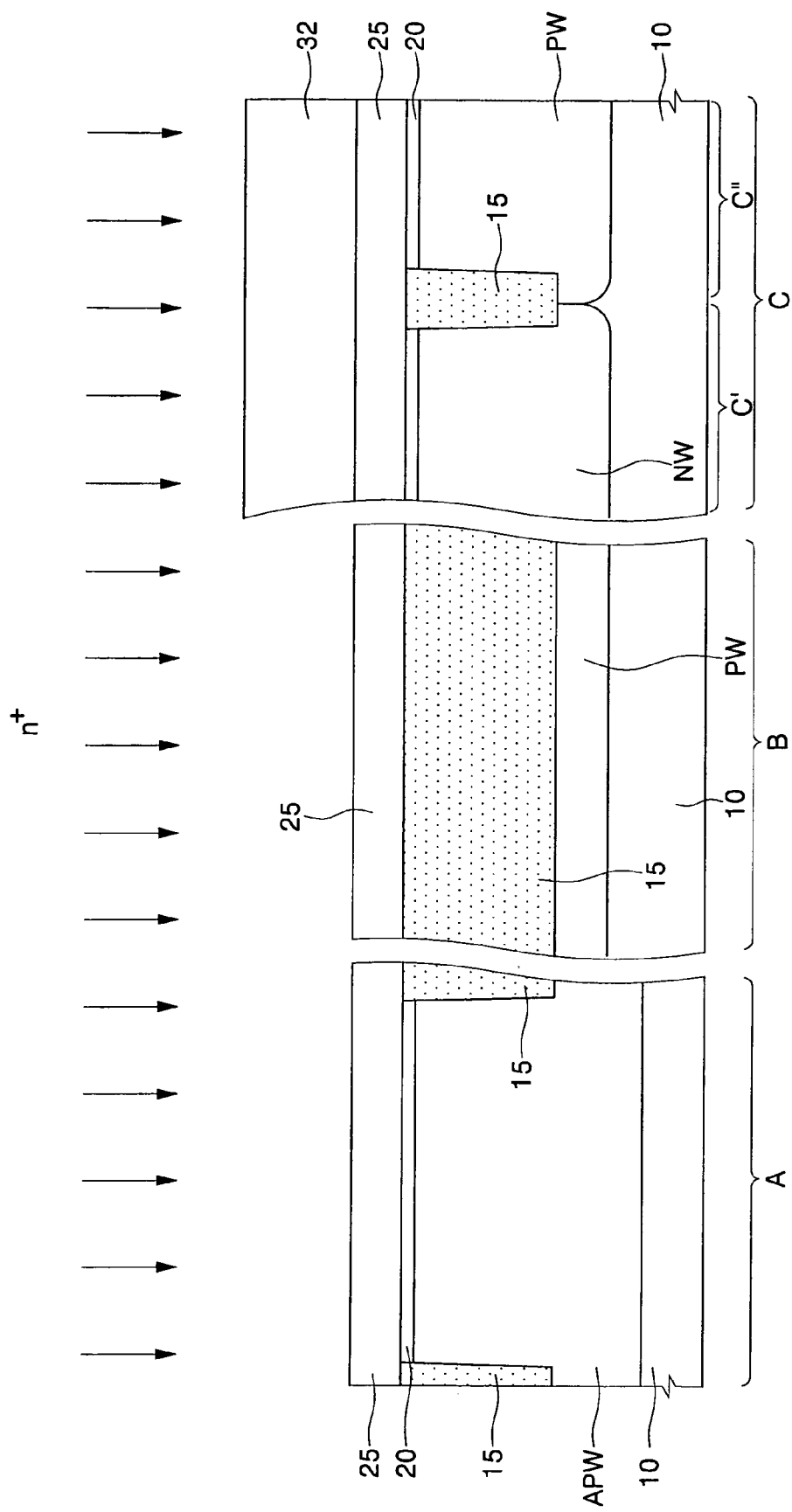
Figure 5B:
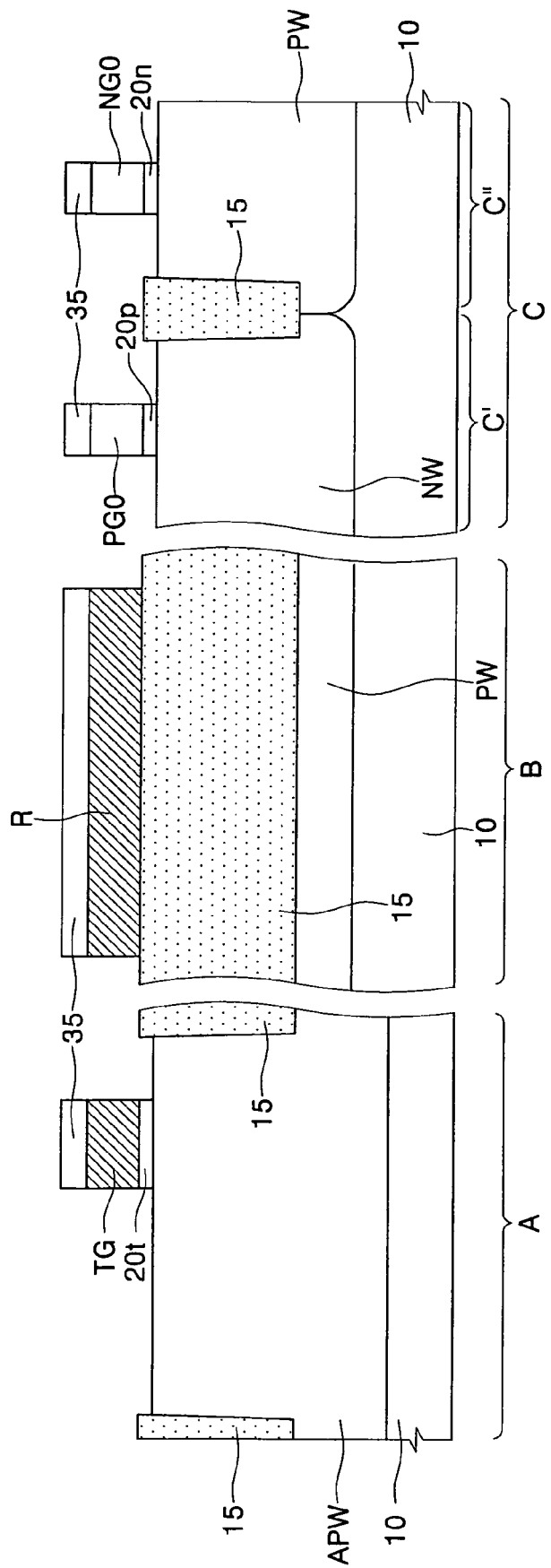

FIGS. 5A and 5B are cross-sectional views illustrating an exemplary method of fabricating an image sensor in accordance with another exemplary embodiment of the present invention.

In the illustrated exemplary method, in accordance with another exemplary embodiment of the present invention, as shown in FIG. 5A, a polysilicon layer 25 is formed on a semiconductor substrate 10 using the same method described with reference to FIG. 4A. After polysilicon layer 25 is formed on semiconductor substrate 10, an n+-type ion implantation mask pattern 32 is formed on semiconductor substrate 10 exposing pixel area A and resistance area B. N+-type ion implantation mask pattern 32 may be a photoresist pattern or a hard mask pattern. Using n+-type ion implantation mask pattern 32, polysilicon layer 25 is doped with n+-type impurity ions at pixel area A and resistance area B.

In the illustrated exemplary method, in accordance with another exemplary embodiment of the present invention, as shown in FIGS. 5A and 5B, after portions of polysilicon layer 25 are doped with n+-type impurities, n+-type ion implantation mask pattern 32 is removed, and a mask layer (not shown) is formed on semiconductor substrate 10. Then, the mask layer and polysilicon layer 25 are sequentially patterned. As a result, a transfer gate electrode TG doped with n+-type impurities and a mask pattern 35 are sequentially formed on semiconductor substrate 10 at pixel area A. Also as a result, a resistance pattern R doped with n+-type impurities and a mask pattern 35 are sequentially formed on an isolation layer 15 at resistance area B.

Further, an NMOS gate electrode NG0 and a mask pattern 35 are sequentially formed on semiconductor substrate 10 at NMOS area C", and concurrently, a PMOS gate electrode PG0 and a mask pattern 35 are sequentially formed on semiconductor substrate 10 at PMOS area C'. Since PMOS gate electrode PG0 and NMOS gate electrode NG0 are formed from portions of polysilicon layer 25 that were covered by n+-type ion implantation mask pattern 32 during the doping described with reference to FIG. 5A, PMOS gate electrode PG0 and NMOS gate electrode NG0 are formed of undoped polysilicon patterns.

When the mask layer and polysilicon layer 25 are sequentially patterned, gate insulating layer 20 is patterned concurrently. Thus, a transfer gate insulating layer 20t is formed below transfer gate electrode TG of pixel area A, and an NMOS gate insulating layer 20n and a PMOS gate insulating layer 20p are formed below NMOS gate electrode NG0 of NMOS area C" and PMOS gate electrode PG0 of PMOS area C', respectively.

Then, the same method steps described with reference to FIGS. 4C through 4E are performed. Specifically, n+-type source/drain regions 60n of NMOS area C" of FIG. 4E are formed, and an NMOS gate electrode NG doped with n+-type impurities, formed by doping NMOS gate electrode NG0 with n+-type impurity ions, is formed. Then, the same processes described with reference to FIG. 4F are performed, thereby forming upper metal interconnections 80 of FIG. 4F.

As described above, in accordance with exemplary embodiments of the present invention, the transfer gate electrode of the pixel area and the resistance pattern of the resistance area are doped substantially uniformly with n+-type impurities. As a result, the dark level problems associated with the conventional photodiode structure, and/or the drive current capacity problems associated with the conventional transfer gate electrode, both of which may be caused by misalignment errors, can be prevented. Further, because the resistance pattern is doped only once, the resistance characteristics of the resistance pattern can be controlled easily. Therefore, the image sensor of the present invention can be provided with excellent performance characteristics.

Though exemplary embodiments of the present invention have been described, the invention is not limited to the embodiments set forth herein. Rather, it will be clear to one of ordinary skill in the art that various modifications may be made to the exemplary embodiments without departing from the scope of the present invention as defined by the following claims.

What is claimed is:

1. A method of fabricating an image sensor, comprising:
preparing a semiconductor substrate, wherein the semiconductor substrate comprises a pixel area, a resistance area and a CMOS area and wherein the CMOS area comprises an NMOS area and a PMOS area;
forming an isolation layer in the semiconductor substrate to define active regions;
forming a polysilicon layer on the semiconductor substrate;
forming an ion implantation mask pattern on the semiconductor substrate after forming the polysilicon layer, wherein the ion implantation mask pattern covers at least the PMOS area;
uniformly doping the polysilicon layer with n-type impurities through the ion implantation mask pattern;
removing the ion implantation mask pattern;
forming a mask layer on the polysilicon layer after removing the ion implantation mask pattern;
patterning the polysilicon layer to form a transfer gate electrode on the pixel area, a resistance pattern on the resistance area, an NMOS gate electrode on the NMOS area, and a PMOS gate electrode on the PMOS area;
patterning the mask layer while the polysilicon layer is patterned, thereby forming mask patterns, wherein each mask pattern is aligned with one of the gate electrodes or the resistance pattern;
forming a photodiode photoresist pattern on the semiconductor substrate after patterning the polysilicon layer and the mask layer;
forming a photodiode in the pixel area using the photodiode photoresist pattern as an ion implantation mask;
removing the photodiode photoresist pattern; and
removing the mask patterns after removing the photodiode photoresist pattern.

2. The method of claim 1, wherein forming the photodiode comprises forming a deep n-type impurity region and a shallow p-type impurity region in a photodiode region using the photodiode photoresist pattern as the ion implantation mask.

3. The method of claim 2, further comprising:

forming a floating diffusion photoresist pattern on the semiconductor substrate after forming the photodiode and removing the photodiode photoresist pattern; and implanting impurity ions into the semiconductor substrate using the floating diffusion photoresist pattern as an ion implantation mask, thereby forming n-type source/drain regions in the NMOS area, and forming an n-type floating diffusion region in an impurity deposition region.

* * * * *